United States Patent
Yach et al.

(10) Patent No.: US 8,072,233 B2
(45) Date of Patent: Dec. 6, 2011

(54) METHOD AND APPARATUS FOR MONITORING VIA'S IN A SEMICONDUCTOR FAB

(75) Inventors: Randy Yach, Phoenix, AZ (US); Tommy Stevens, Chandler, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 13/033,792

(22) Filed: Feb. 24, 2011

(65) Prior Publication Data

US 2011/0140728 A1 Jun. 16, 2011

Related U.S. Application Data

(62) Division of application No. 12/128,403, filed on May 28, 2008, now Pat. No. 7,919,973.

(60) Provisional application No. 60/936,925, filed on Jun. 22, 2007.

(51) Int. Cl.
*G01R 31/00* (2006.01)
*G01R 31/26* (2006.01)

(52) U.S. Cl. ................. 324/762.01; 324/750.3

(58) Field of Classification Search .................. None
See application file for complete search history.

(56) References Cited

U.S. PATENT DOCUMENTS

| | | | | |
|---|---|---|---|---|
| 4,719,411 | A | 1/1988 | Buehler | 324/73 R |
| 4,829,238 | A | 5/1989 | Goulette et al. | 324/95 |
| 5,627,779 | A | 5/1997 | Odake et al. | 365/185.01 |
| 5,757,884 | A * | 5/1998 | Alexandrescu | 378/98.7 |
| 6,483,368 | B2 * | 11/2002 | Mayer et al. | 327/365 |
| 6,503,765 | B1 | 1/2003 | Chao et al. | 438/14 |
| 6,856,161 | B2 | 2/2005 | Thewes | 324/769 |
| 7,307,338 | B1 * | 12/2007 | Mandell et al. | 257/643 |
| 7,335,603 | B2 * | 2/2008 | Mancevski | 438/758 |
| 2002/0089345 | A1 | 7/2002 | Doong et al. | 324/765 |
| 2006/0245235 | A1 | 11/2006 | Krieger | 365/115 |

FOREIGN PATENT DOCUMENTS

| | | |
|---|---|---|
| EP | 0239251 A2 | 2/1987 |
| EP | 0448263 A2 | 3/1991 |

OTHER PUBLICATIONS

International PCT Search Report and Written Opinion, PCT/US2008/067595, 13 pages, Sep. 30, 2008.

* cited by examiner

*Primary Examiner* — Vinh Nguyen (74) *Attorney, Agent, or Firm* — King & Spalding L.L.P.

(57) ABSTRACT

A method for monitoring a semiconductor fabrication process creates a wafer of semiconductor chips. Each chip has a one or more diodes. Each diode is addressable as part of an array, corresponds to a physical location of the chip, and is connected in series to a stack. The stack is composed of one ore more vertical interconnects and metal contacts. The diode and associated stack of vertical interconnects is addressed, and the current through each of the stacks of vertical interconnects in an array is measured.

26 Claims, 13 Drawing Sheets

EVALUATE HIGH ANOMALY VIA CONDITION

A := measurement data array
N := Array size
factor := 6
upperLimit := Median + IQR*factor
errorCount := 0
For each array element A from I=1 to N do loop
    If value of ($A_i$) > upperLimit then
        errorCount := errorCount + 1
        save the value of ($A_i$)
        save the address of ($A_i$)
        If errorCount > 25 then
            Exit loop
        End if
    End if
End loop ErrorCount now contains the number of high anomaly via's

*FIG. 14C*

METHOD AND APPARATUS FOR MONITORING VIA'S IN A SEMICONDUCTOR FAB

CROSS-REFERENCE TO RELATED APPLICATIONS

This application is a Divisional of U.S. patent application Ser. No. 12/128,403 filed May 28, 2008, now U.S. Pat. No. 7,919,973, which claims the benefit of U.S. Provisional Application No. 60/936,925 filed on Jun. 22, 2007. The contents of which are hereby incorporated by reference in their entirety.

TECHNICAL FIELD OF THE INVENTION

This invention relates generally to the field of monitoring the process of semiconductor fabrication of integrated circuits, whose products encompass a myriad applications in various technical fields.

BACKGROUND

Semiconductor fabrication of integrated circuits continues to supply vital equipment to a myriad of technological fields. Integrated circuits continue to grow increasingly complex and densely filled with components. Accordingly, manufacturing these integrated circuits becomes more difficult. Makers of integrated circuits spend considerable effort increasing the yield of the fabrication process as well as increasing the reliability of its output. The metal interconnect system employed during the manufacturing of large and very large scale integrated circuits is of special concern to the yield and reliability of these products.

During the process of creating a semiconductor-based integrated circuit, various layers of semiconductors, metals, insulators, and other materials are deposited and patterned in layers on top of each other. Masks are employed to control the process and pattern to create connections between circuit elements. These connections can be either horizontal or vertical in nature. The horizontal interconnect layers are joined together by vertical connections called vias. These connections may be made between metal layers or from a metal layer to a semiconductor layer, in which case the connection is commonly referred to as a contact. All vertical interconnects will be hereafter referred to as vias.

The complexity of modern integrated circuits has been increasing due to both the further miniaturization of the circuits and also to the increase in the number of elements included in these systems and circuits. As the circuits become more complex, more layers are required to connect the ever increasing number of circuit elements. This further results in a required increase in the number of vias necessary to complete the interconnects. Additionally, because the vias are typically very small in size compared to the horizontal interconnections, they are more prone to be affected by defects in the semiconductor manufacturing process. Hence, one problem area for any modern semiconductor manufacturing process is the ability to make reliable and repeatable vias.

An error in the manufacturing of an integrated circuit can cause a faulty via, which could interrupt or significantly change the flow of electricity on a wire, or cause a component to malfunction. The cause of the error may be due to random defects, or due to a systematic problem with the manufacturing process that fabricates the integrated circuits. Further, a weak via may not cause the chip to fail immediately, but may degrade over time in the field, creating a reliability concern.

A semiconductor manufacturer can increase a process's ability to produce reliable and consistent vertical interconnects by using a test structure containing a large chain of horizontal and vertical interconnects. This structure is typically used during the process development phase, and aids the process engineers in evaluating the robustness of the interconnect system. After the initial process development work, the integrated circuits rather than test structures are used to monitor the health of the process technology by metrics such as test yield and reliability experiments. Using the large integrated circuits for monitoring the health of the process can be problematic. When the product fails a test program, it is very difficult to determine the exact location and root cause of the failure because of the shear complexity of the device. A process using a test structure consisting of a chain of horizontal metal and vertical vias might be impractical because it does not pinpoint which specific element in the interconnect system caused the failure.

One solution to make the via manufacturing process more robust is to design a two dimensional array of vias where it is possible to test individual vias through a decoding scheme utilizing transistors as switches to turn on and off connection paths to be tested. However, transistors occupy a significant amount of silicon area so as to limit how many vias can be placed within the test structure. Further, a significant amount of current may be necessary to accurately measure the actual via resistance. Transistors are relatively limited in the current they can carry. Thus, there exists a need for an improved process to monitor a via interconnect system in a semiconductor manufacturing process.

BRIEF DESCRIPTION OF THE DRAWINGS

For a more complete understanding of the present invention and advantages thereof, reference is now made to the following description taken in conjunction with the accompanying drawings, in which.

DETAILED DESCRIPTION

Figure 1:
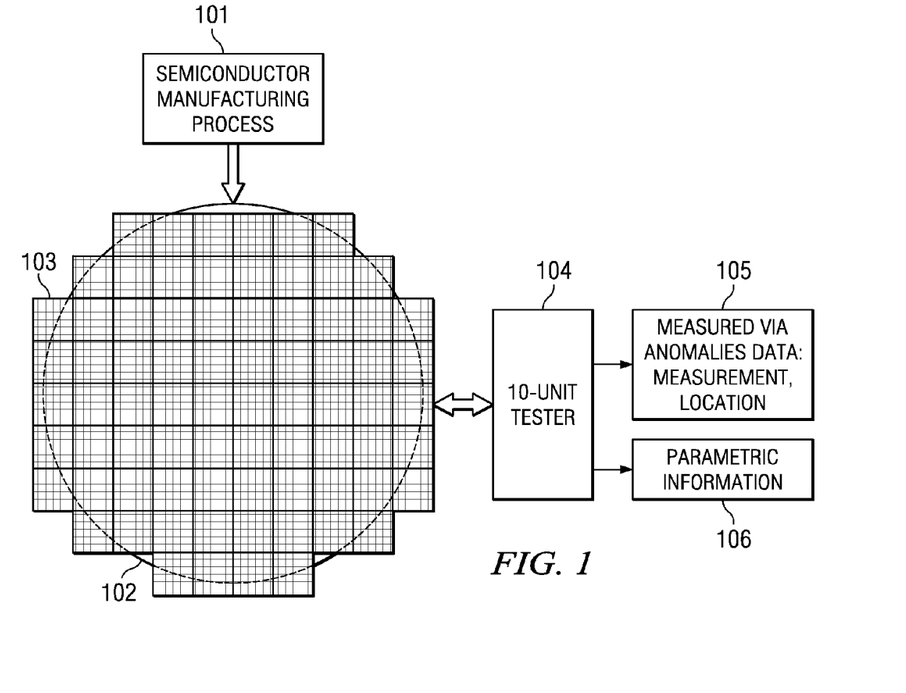
FIG. 1: Overview Of Monitoring Process

FIG. 1 shows the general process by which an embodiment of the current invention may monitor a semiconductor manufacturing process by testing stacks of vertical interconnects and metal contacts. A semiconductor manufacturing process 101 to be monitored or evaluated creates a wafer 102 containing a plurality of chips 103. In one embodiment of the invention, each chip contains a plurality of diodes arranged in an addressable array. Each diode may have an associated stack of vertical interconnects and metal contacts. Each chip is tested by a probing tester 104 to find the location and measurement of stacks that do not meet specifications. In one embodiment, a tester 104 that can test ten different chips in parallel is used. In one embodiment, all ten chips are tested at the same time. In one embodiment, the same stack on each chip is tested at the same time. The tester 104 yields information, such as data sets for measured anomalies 105 containing the measurement as well as the location of the measurement. The anomalies are current measurements or associated resistance calculations of vias on the wafer that are open, meaning no current was measured, or current measurements that do not meet certain criteria. The tester 104 may also yield parametric information 106 detailing the tests that were conducted. By analyzing the measurements returned by the tester, possible problems in the manufacturing process may be detected.

Figure 2:
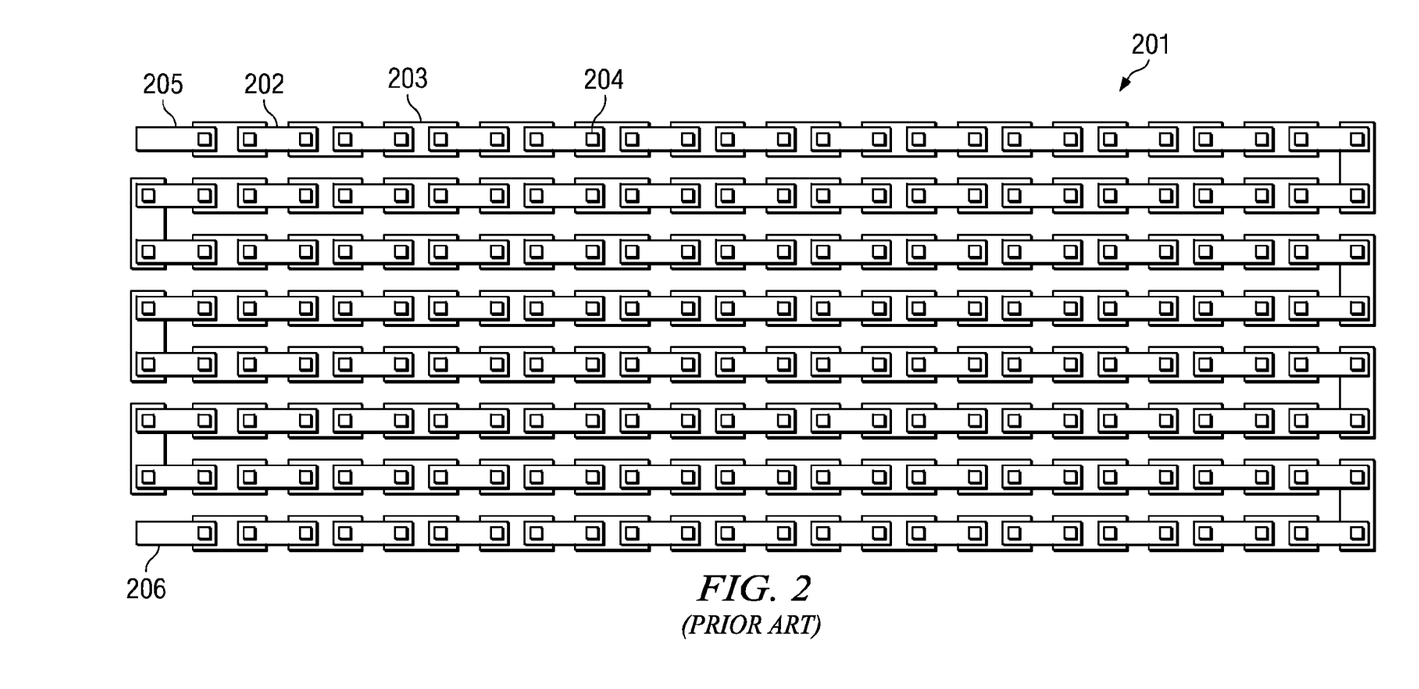
FIG. 2: Prior Art—Via Chain Testing

FIG. 2 shows prior art for monitoring a semiconductor manufacturing process by creating a chip comprising a series of components connected together in a chain 201 so as to contain multiple vias over a certain area of the chip. Connections are made between two different layers 202, 203. The layers may be made from metal or semiconductors. The interconnection of the two layers forms the via 204. Consequently, a large number of vias are contained within the chain to cover an area of the chip. To test the vias, the current flowing through the chain is measured after applying a potential between the top 205 of the chain and the bottom 206 of the chain. A failed via will cause the current flowing through the chain to drop.

Figure 3:
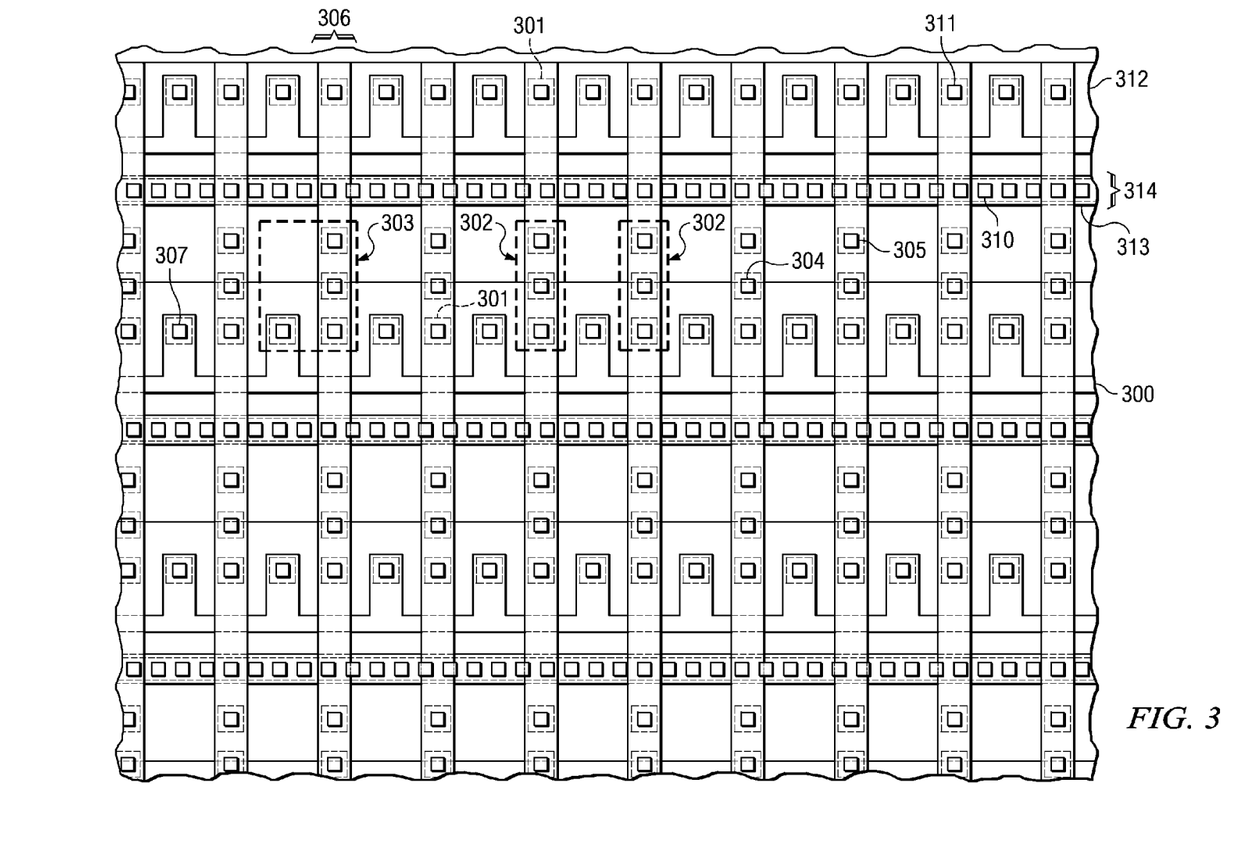
FIG. 3: Test Chip

FIG. 3 shows that in one embodiment of the invention each chip is built with a plurality of diodes and associated stacks of vertical interconnects and metal contacts aligned in a grid. A diode 301 is laid out through a deposition process described below. The diode 301 is connected to a stack 302 of vertical interconnects and metal contacts, forming a combination 303. The stack 302 may comprise several levels of vertical interconnects and metal contacts. A first contact 304 contained within the stack 302 serves to connect the stack 302—and therefore the combination 303—to other stacks and diodes in the same column 306 of diode and stack combinations 303. A second contact 305 contained within the stack may comprise various other levels of vertical interconnects and metal contacts, which may not serve a connective function within the chip, but exist for testing purposes. The anode 307 of the diode is connected to the anodes 307 of other diodes 301 in the same row 308 through a contact layer. Substrate contacts 310 also connect parasitic transistors formed by the series combination of a P+ contact 311 arranged in an N-Well 312 which itself is arranged in a P+ substrate 313. A contact layer 314 serves both as a substrate connection as well as the emitter of the parasitic PNP transistor.

In one embodiment, the diode and stack combinations 303 comprise an addressable diode read-only-memory array. In one embodiment, the chip is comprised of 9,216 unique addressable diode and stack combinations 303. The physical location of each combination 303 is known or can be determined by knowing the test, tester, and address used to test the combination 303. Other physical layouts may be used so long as the physical location of an individual diode and related stack can be found.

Figure 4:
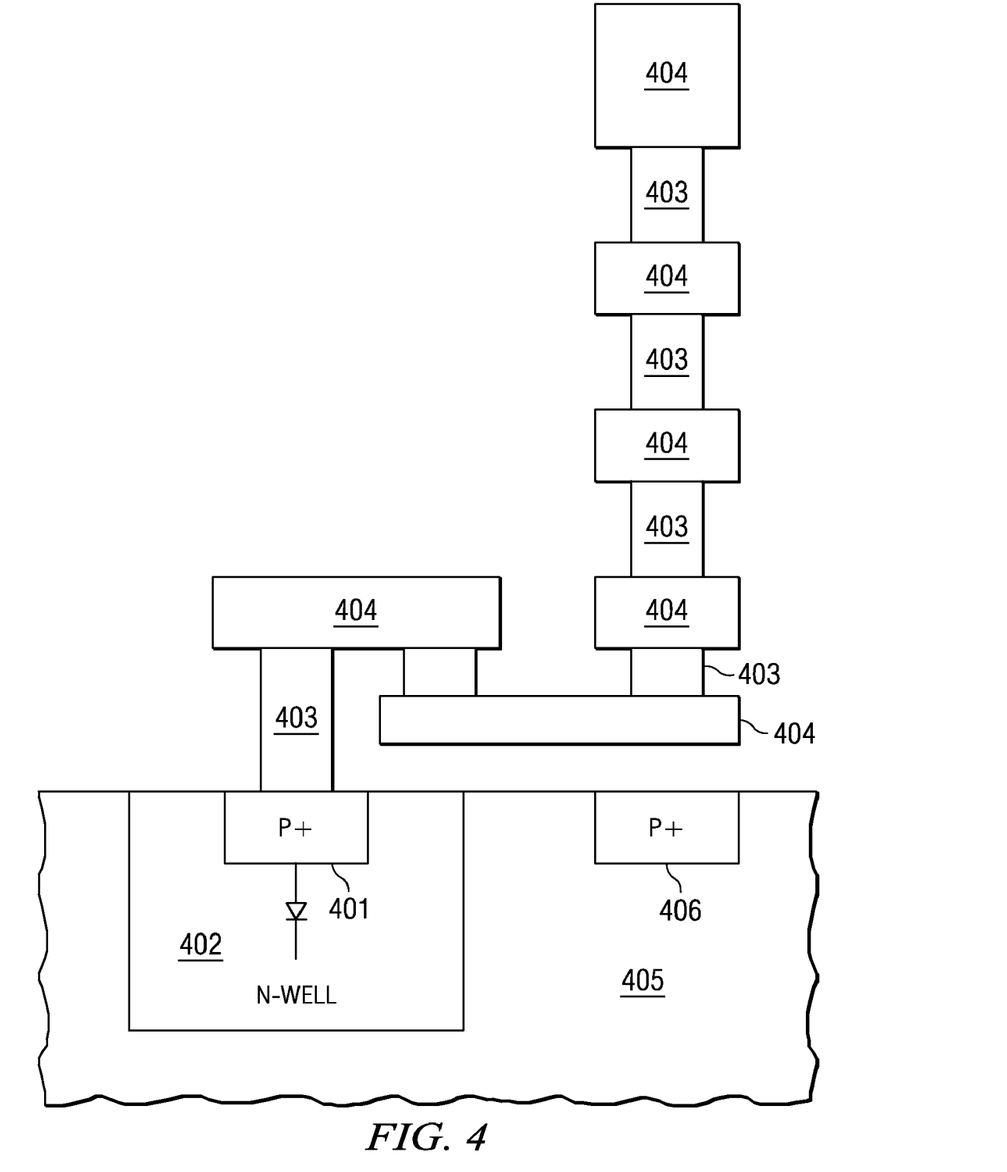
FIG. 4: Cross Section Of A Diode And Associated Stack

FIG. 4 shows a cross-section of a diode and associated stack. To form the diode, a P+ region 401 is deposited into a N-Well 402. This arrangement forms the basic structure of a p-n junction of a diode. The N-Well 402 may itself be arranged in a P+ substrate 405. Above this diode are deposited various layers of connections, possibly including contacts 403 and metal interconnects 404. These layers form the stack of connections that will be used for monitoring the via process. The stack is connected to the diode through the contact 403, which serves as a terminal for the diode's cathode. In one embodiment, by depositing the N-Well 402 into a P-Well 405 substrate, a parasitic PNP bipolar transistor is also created. To access the functionality of this transistor, an additional P+ region 406 may be deposited into the substrate 405 in order to provide a connection from the substrate 405.

Figure 5:
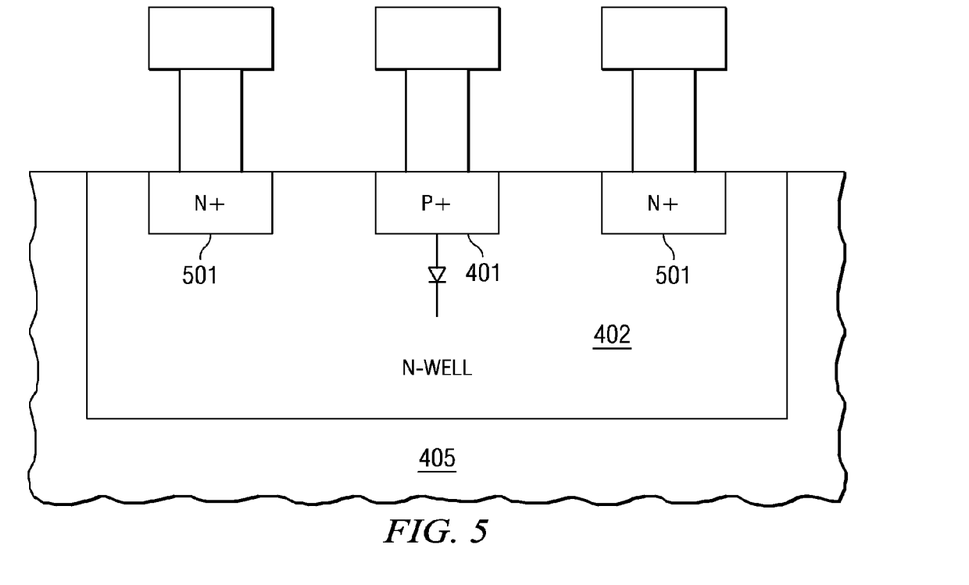
FIG. 5: Side-View Of Cross Section Of A Diode And Associated Stack

FIG. 5 shows a cross section of the diode and associated stack rotated ninety degrees from FIG. 3. A plurality of N+ regions 501 are deposited into the N-Well 402 in order for a connection to be made to the anode of the diode. The N+ regions 501 on each diode and stack combination may be connected to the other combinations within the same row of diodes.

Figure 6:
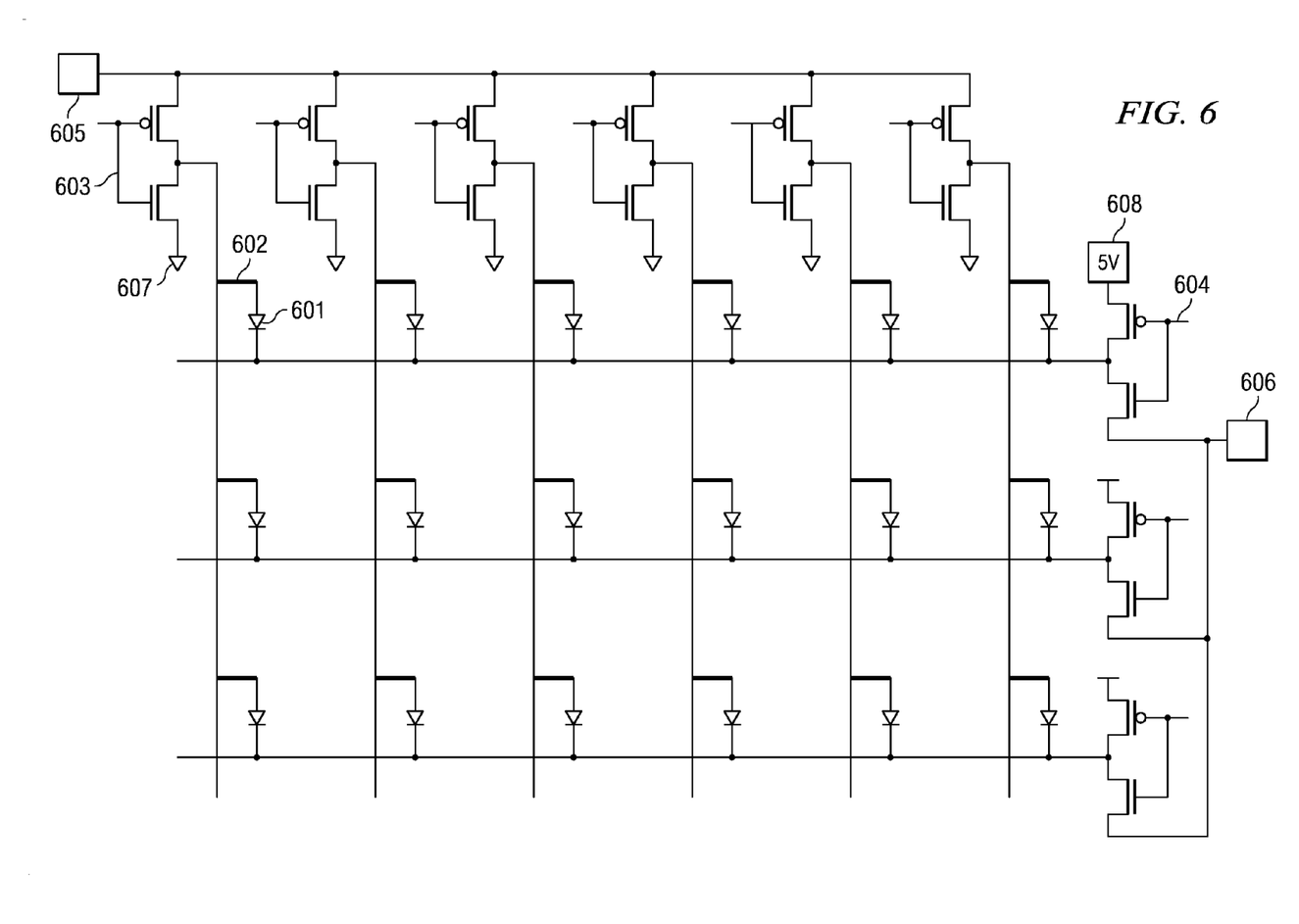
FIG. 6: Circuit Equivalent of the Diode Arrangement

FIG. 6 shows an electrical circuit of the arrangement of the diodes in one embodiment of the invention. To address the diodes as an array, the diodes 601 have been laid out and are connected as a two-dimensional array with columns and rows. Corresponding to each diode is a stack 602 of vertical interconnects and metal contacts. In one embodiment, a plurality of inverters 603 are connected to each column of diodes at the cathode and act as a control mechanism for selecting which column contains the diode and associated stack that will be tested. A plurality of inverters 604 are connected to each row of diodes at the anode and act as a control mechanism for selecting which row contains the diode and associated stack that will be tested. A voltage source 605 is connected to the column inverters 603, and a voltage sink 606 is connected to the row inverters 604. In one embodiment of the invention, the voltage source 605 is four volts, and the voltage sink 606 is one volt. Each column inverter 603 also has inputs for selecting whether the inverter will route the voltage source 605 or instead a low voltage 607. In one embodiment of the invention, the low voltage is ground. Each row inverter 604 also has inputs for selecting whether the inverter will route the voltage sink 606 or instead a high voltage 608. In one embodiment of the invention, the high voltage is five volts. The stack 602 of vertical interconnects and contacts is in series with the column selector inverter 603 and the diode 601.

Figure 7:
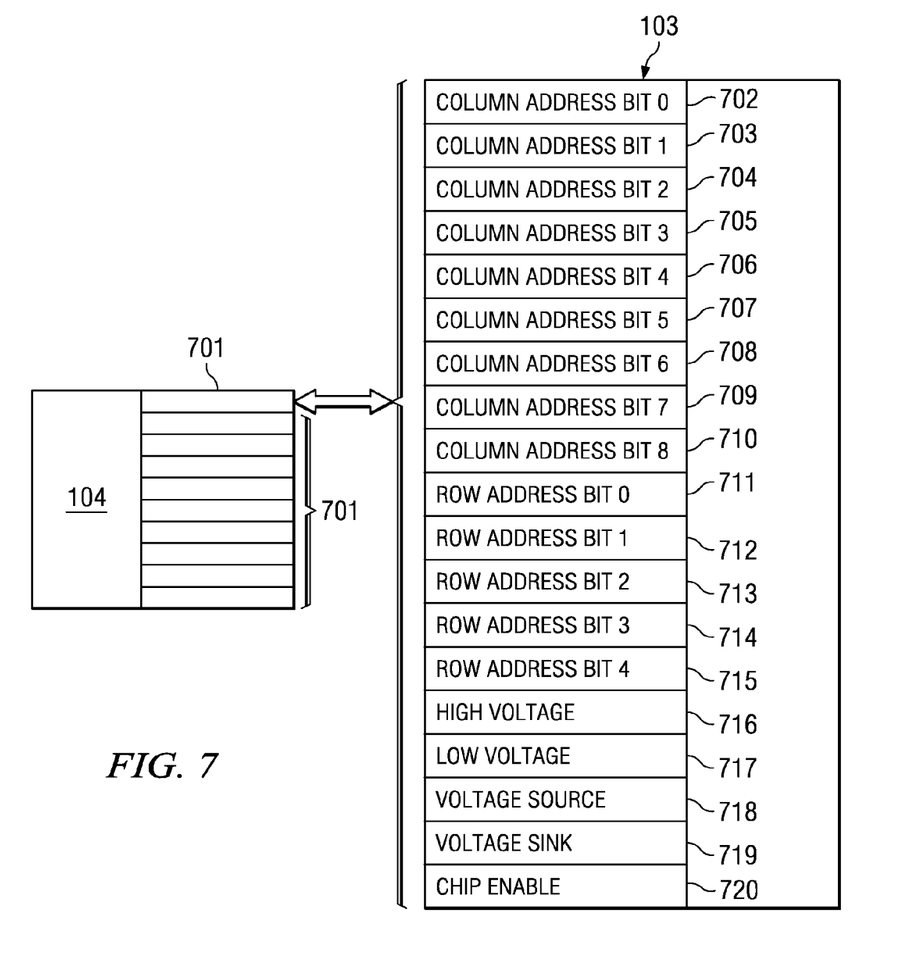
FIG. 7: Tester and Chip Interface Apparatus

FIG. 7 shows the means by which the tester 104 will access the chip 103 for testing. In one embodiment, the tester has ten separate test heads 701, each capable of testing a chip 103 in parallel with other test heads 701. Each test head 701 can access the chip 103 through a series of pins. A plurality of column address bits 702-710 may be used to address the column of the stack to be tested. A plurality of row address bits 711-715 may be used to address the row of the stack to be tested. A high voltage pin 716 may be used to provide power to the chip, as well as a voltage to the anode of diodes corresponding to stacks not under test. A low voltage pin 717 may be used to provide ground to the chip 103, as well as a voltage to the cathode of diodes corresponding to stacks not under test. A voltage source pin 718 may be used to provide a positive voltage on the cathode side of a diode and stack combination under test. A voltage sink pin 719 may be used to provide a voltage relatively smaller than the voltage source on the anode side of a diode and stack combination under test. A chip enable pin 720 may be used to enable or disable measurement of current. Current may be measured by the test head 701 by examining the flow of current into the voltage source pin 718.

Figure 8:
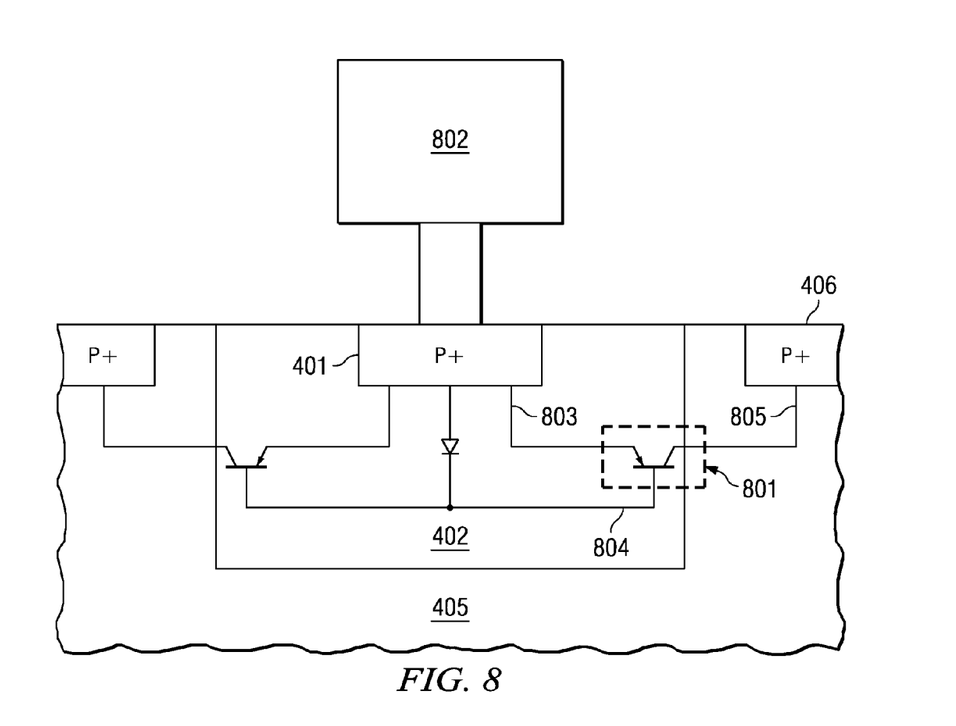
FIG. 8: Parasitic Bipolar Transistor

FIG. 8 shows an enhanced embodiment of the invention comprising arranging the diode into a P+ substrate, forming a transistor which allows more current to flow through stack. The accuracy of the stack resistance calculation increases with the amount of current that can flow through the stack. The diode and stack are connected in series, and consequently the diode acts as the limiting factor in the amount of current that can flow through the stack.

If the diode, created by depositing a P+ region 401 into an N-Well 402, is itself arranged in a P+ substrate 405, a PNP transistor 801 is formed. The current able to flow through the stack 802 be increased by utilizing this transistor. As shown in FIG. 4, second P+ regions 406 are added to access the transistor through its collector terminal 805. In one embodiment, the second P+ regions are connected to other P+ regions on other diode and stack combinations. In one embodiment, the second P+ regions are connected to ground. The first P+ region 401 forming the diode connects the stack 802 to the emitter terminal 803 of the transistor. The N-Well 402 connects the anode of the diode to the transistor base terminal 804.

Figure 9:
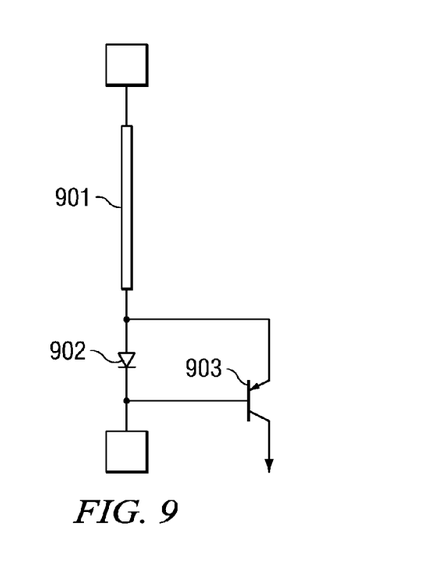
FIG. 9: Circuit Equivalent Showing Stack, Diode, And Transistor

FIG. 9 demonstrates the circuit equivalent of these elements. The via stack 901 is connected in series with the combination of the diode 902 and the parasitic transistor 903, the diode 902 and the parasitic transistor 903 being connected in parallel. The flow of a small amount of current from the diode 902 into the base of the transistor 903 activates the forward mode of the transistor 903, causing current to flow through the transistor. The result is that more current can flow through the stack 901.

Figure 10:
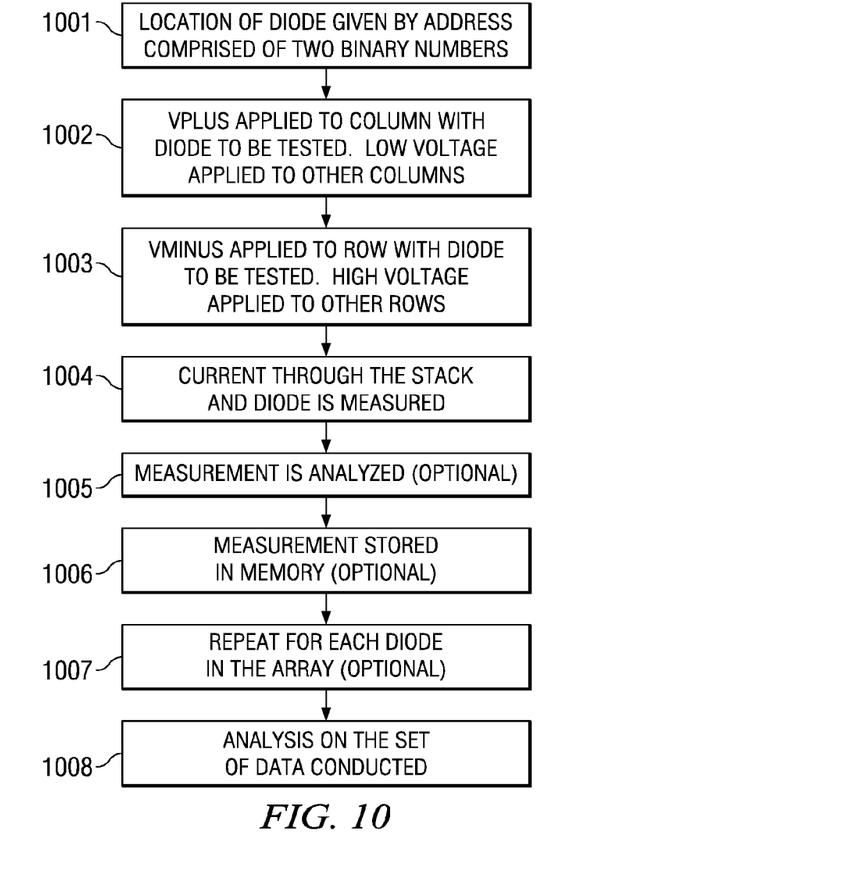
FIG. 10: Vertical Interconnect Test Steps

FIG. 10 shows the operation of the chip to measure the current through a stack of vertical interconnects and metal contacts according to one embodiment of the invention. In step 1001, a location corresponding to a diode and associated stack is given by an address comprised of two binary numbers. In one embodiment of the invention, the first binary number represents the column and the second binary number represents the row of the diode and associated stack that is to be tested. One embodiment utilizes nine pins to address columns and five pins to address rows in the two-dimensional array. In one embodiment of the invention, the addresses begin at (000000000, 00000) representing the diode at the upper left corner of the array, and extend to (101111111, 10111) representing the diode at the lower right corner of the array.

In step 1002, the address is decoded so that a plurality of inverters can apply a voltage to the columns of diodes and associated stacks. In one embodiment of the invention, the voltage to be applied to the columns is applied at the cathode of the diode, but first passes through the stack of vertical interconnects and metal contacts. For the column containing a diode and associated stack under test, the voltage applied is a voltage source. In one embodiment of the invention, the voltage source is four volts. The voltage source is routed to all diodes and associated stacks in the column. For any remaining columns which do not contain a diode and associate stack to be tested, a low voltage is applied to each diode and stack combination in the column. In one embodiment of the invention, this low voltage is zero volts.

In step 1003, the address is decoded such that a plurality of inverters may connect a voltage to the rows of diodes and associated stacks. In one embodiment of the invention, the voltage to be applied to the rows is applied at the anode of the diode. For the row containing a diode and associated stack under test, the voltage applied is a voltage sink. In one embodiment of the invention, the voltage sink is one volt. The voltage sink is routed to all diodes and associated stacks in the row. For any remaining rows not containing a diode and stack under test, a high voltage is applied. In one embodiment of the invention, the high voltage is five volts.

Thus, in the entire two dimensional array of diodes, only diodes and their associated stacks under test will have a positive voltage differential between their cathode and anode terminals, causing current to flow from the voltage source through the stack and diode to the voltage sink. All other diodes will have a neutral or negative voltage differential, causing no current to flow through the diode and associated stack.

In step 1004, the current through the plurality of diodes and stacks under test is measured to determine the resistance of the stack. The voltage drop across these elements is a known quantity. The current will vary with the resistance of the stack of vertical interconnects and metal contacts.

In step 1005, the measured current is optionally analyzed. In one embodiment, the measured current may be compared against a known value or range. A current measurement within a pre-determined range (derived from experience with the fabrication process) may indicate that the stack of vertical interconnects and metal contacts does not likely contain a defect. On the other hand, a current measurement higher or lower than the accepted value or range may indicate that a defect exists within the stack of vertical interconnects. Other methods of comparison may be used. In one embodiment, the measurement value is evaluated as to its statistical likelihood given a standard deviation (determined through experience with the fabrication process). A measurement whose statistical likelihood exceeds a certain probability may indicate that a defect exists within the stack of vertical interconnects and metal contacts. In one embodiment, the measurement may be discarded if it is found to be within acceptable parameters. In one embodiment, current measurements are converted to resistance calculations, which in turn is analyzed using comparison, ranges, or statistical methods.

In step 1006, the measurement may be optionally saved into memory. I one embodiment, the measurement is stored into physical random-access-memory only, without exporting or writing to a file. The address of the diode and stack combination corresponding to the measurement may be stored. To save memory space, this address may be omitted instead. An indication of whether the measurement met acceptable parameters may also be included.

In step 1007, steps 1001-1006 are optionally repeated. In one embodiment, steps 1001-1006 are repeated for all diode and stack combinations on the chip. In one embodiment, steps 1001-1006 are repeated for all the diode and stack combinations in a single row or a single column.

In step 1008, optional analysis on the set of data generated by step 1007 is conducted, and described in further detail below in the discussion of FIG. 11.

Figure 11:
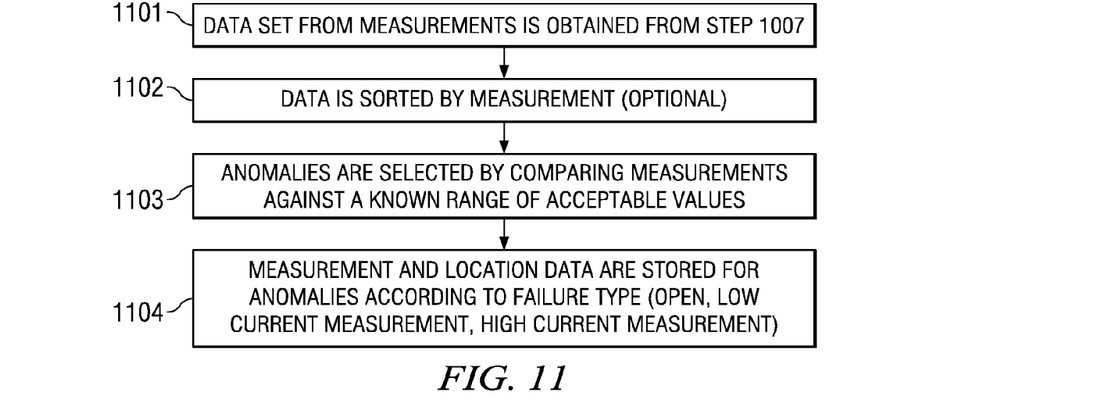
FIG. 11: Analysis Of Via Test Using Setpoints

FIG. 11 demonstrates how a data set from a series of diode and stack tests may be analyzed using setpoints in one embodiment of the invention. In step 1101, the measurements generated from step 1007 are collected. According to one embodiment, the data is collected into an array containing each measurement and its corresponding addresses. In step 1102, the data is optionally sorted according to measured value. In step 1103, each measurement is compared against a known accepted value or a range of known accepted values. Measurements outside the accepted criteria are selected as anomalies. In one embodiment, measurements with very low values represent open vias, through which no or only nominal current flows. In one embodiment, such open vias are indicated by a current value less than 1E-9 amps. In step 1104, the set of anomalies are reported or stored, along with chip identifying information. Anomalies can optionally be stored into bins according to the way by which each failed. In one embodiment, bins are provided for open vias, vias with low current measurements, and vias with high current measurements. In one embodiment, the subsequent selection of anomalous measurements is skipped once a predetermined number of anomalies are found.

Figure 12:
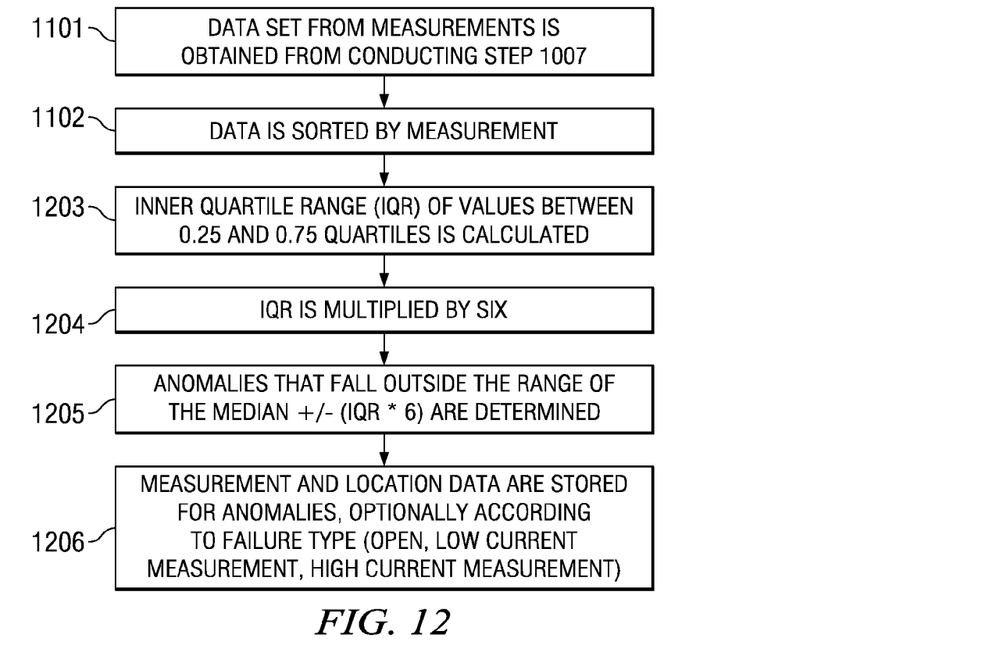
FIG. 12: Analysis Of Via Test Using Inner Quartile Method

FIG. 12 demonstrates how a data set from a series of diode and stack tests may be analyzed using an inner quartile method in one embodiment. Step 1101 and step 1102 are conducted, gathering and sorting the measurements in order. In step 1203, the range of values from the between two given quartiles is calculated. The range of values is known as IQR. The quartiles are selected so as to represent a large number of measurements corresponding to normally functioning diodes and vertical interconnect stacks. In one embodiment of the invention, the range between the 0.25 quartile and the 0.75 quartile is used, and thus the inner quartile range is the middle 50% of the data set. In step 1204, the inner quartile is multiplied by a factor. In one embodiment of the invention, the factor is 6. In step 1205, anomalies in the data set are determined by finding those measurements whose value lies beyond the median plus or minus the factor times IQR.

$$\text{Acceptable range} = \text{Median} +/- (IQR * \text{factor}) \quad \text{FORMULA 1}$$

Measurements outside the accepted criteria are marked as anomalies. In step 1206, the set of anomalies are reported or stored, along with chip identifying information. Anomalies can optionally be stored into bins according to the way by which each failed. In one embodiment, bins are provided for open vias, vias with low current measurements, and vias with high current measurements.

Figure 13:
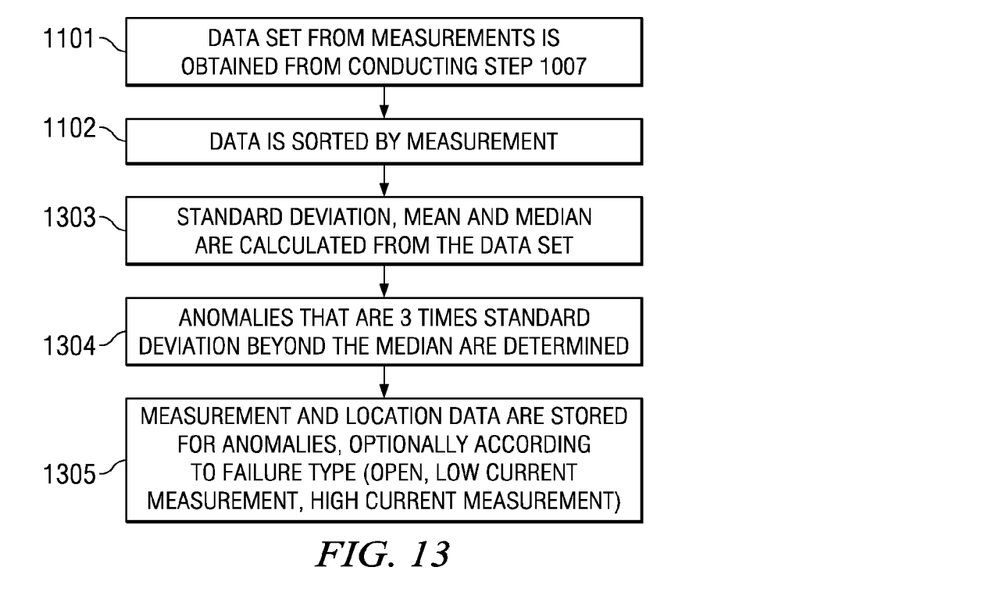
FIG. 13: Analysis Of Via Test Using Standard Deviation

FIG. 13 demonstrates how a data set from a series of diode and stack tests may be analyzed using a standard deviation in one embodiment of the invention. Step 1101 and step 1102 are conducted, gathering and sorting the measurements in order. In step 1303, the standard deviation is determined. In one embodiment of the invention, the standard deviation is calculated from the data set. In one embodiment of the invention, the standard deviation is given as a known value. In step 1304, anomalies in the data set are determined by finding those measurements whose value lies three standard deviations or beyond a mean or median value. In step 1305, the set of anomalies are reported or stored, along with chip identifying information. Anomalies can optionally be stored into bins according to the way by which each failed. In one embodiment, bins are provided for open vias, vias with low current measurements, and vias with high current measurements.

Figure 14A:
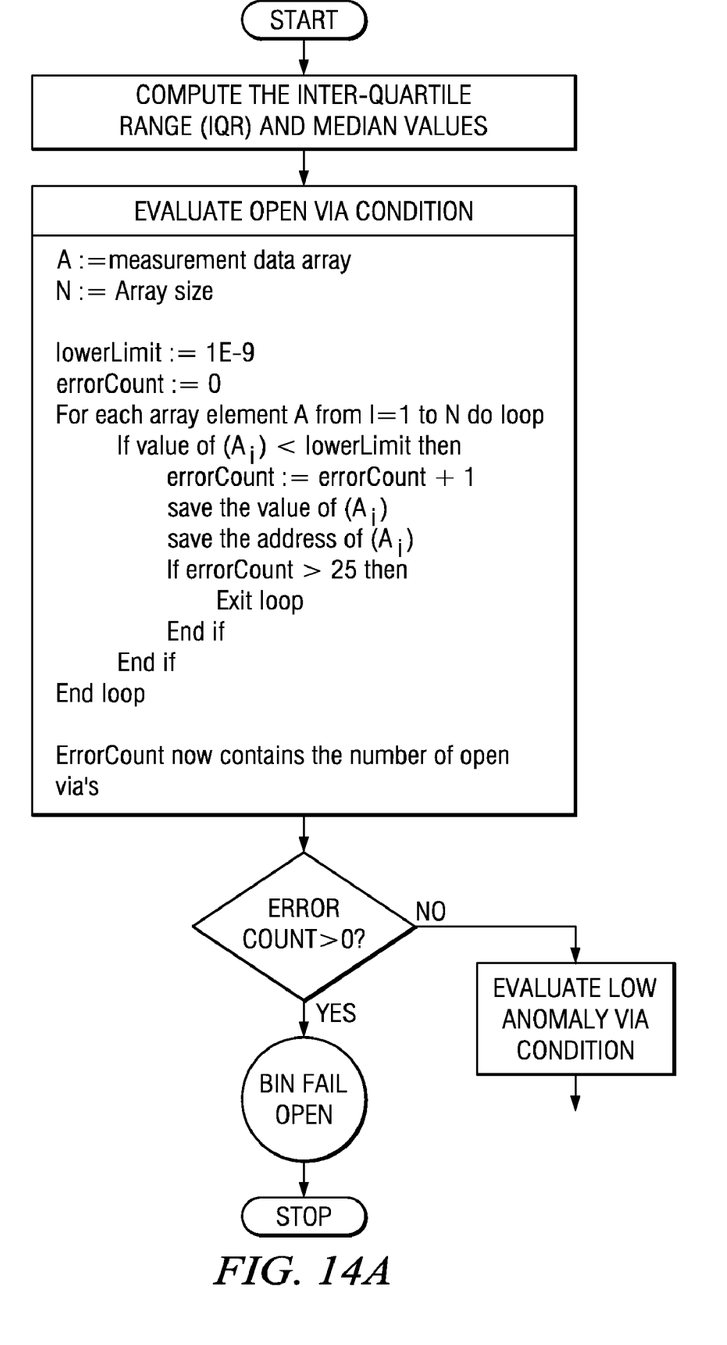
FIGS. 14A-C: Specific Embodiment Of Analysis Process
Figure 14B:
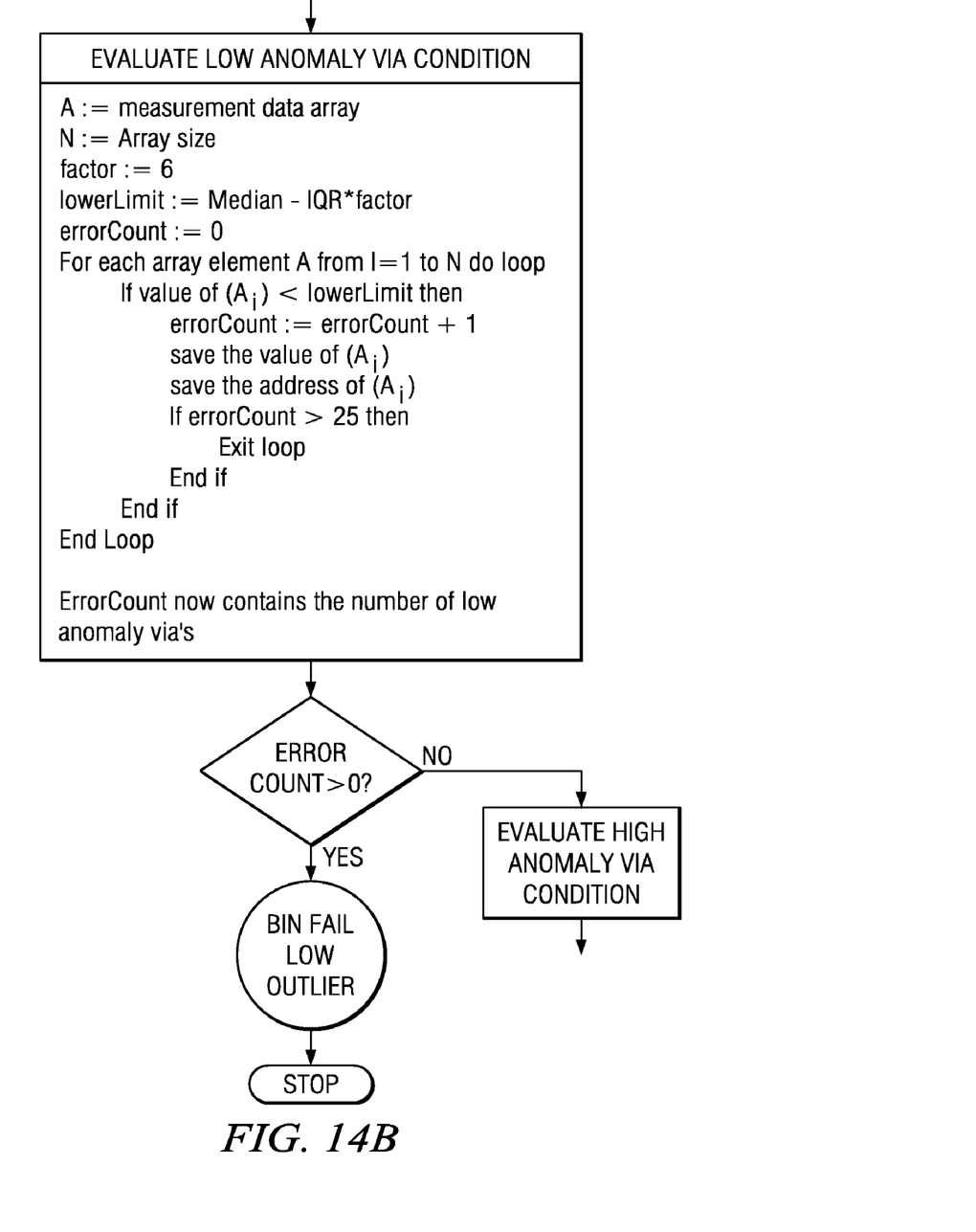
Figure 14C:
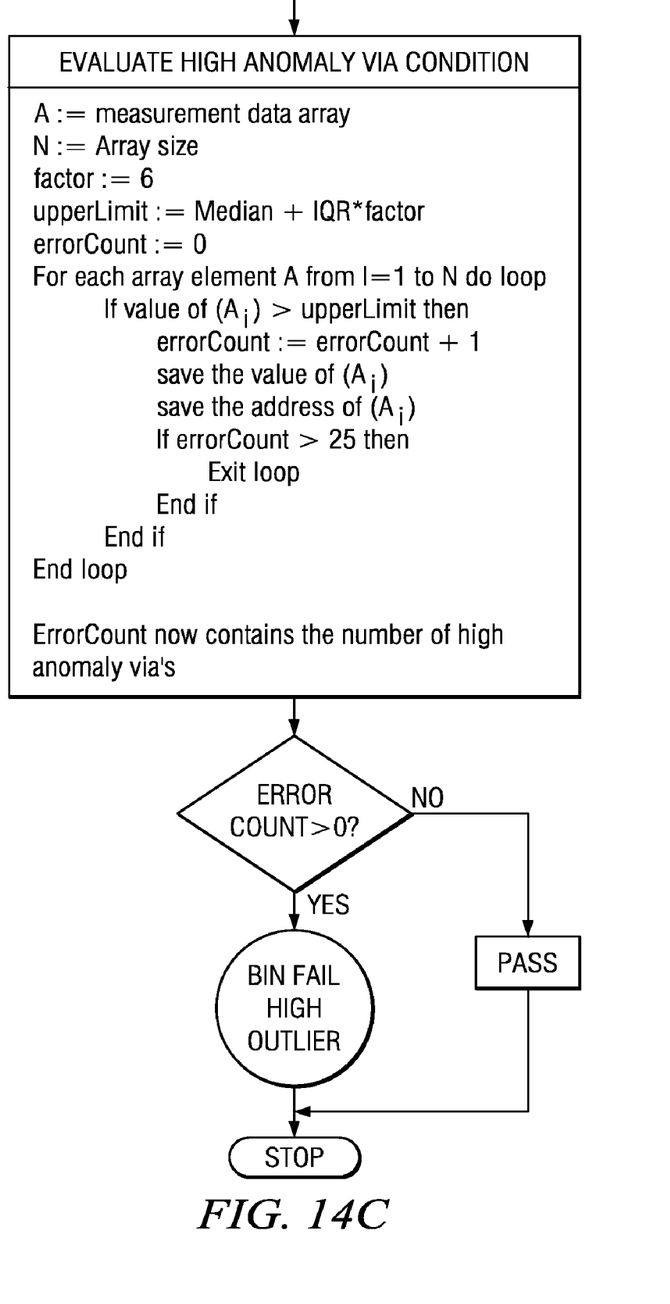

FIG. 14 demonstrates a specific example embodiment of the analysis process. The inner-quartile and median values are calculated. In this embodiment, open Via conditions are first tested. For each via measurement in the array A, the value of the measurement is compared to a lower limit. In one embodiment, this lower limit is a very low value. For each measurement found to be below the threshold, the error count, or anomaly count, is incremented. The value and the address of the measurement is stored. In one embodiment, the analysis sequence ends if more than 25 anomalies are found. Once analysis of open via ends, if the analysis process revealed any open via measurements, the process ends and the measurements are stored and categorized. Otherwise, the array is tested for low measurements. Each measurement is compared against a lower limit, which is calculated in one embodiment by subtracting the inner quartile range times a factor from the median. Any measurements outside of this range are stored along with the associated address. In one embodiment, if the number of low measurements exceeds 25, the analysis is interrupted. Once analysis of low measurements ends, if the analysis process revealed any low measurements, the process ends and the measurements are stored and categorized. Otherwise, else the array is tested for high measurements. Each measurement is compared against a higher limit, which is calculated in one embodiment by adding the inner quartile range times a factor to the median. Any measurements outside of this range are stored along with the associated address. In one embodiment, if the number of high measurements exceeds 25, the analysis is interrupted. Once analysis of high measurements ends, if the analysis process revealed any low measurements the measurements are stored and categorized. Otherwise, else the array is tested for high measurements.

The yield of an individual chip is measured by the number of anomalies per data set. In one embodiment, the anomalies are categorized according to how they failed. In one embodiment, open measurements, low current measurements, and high current measurements are stored in different data sets. Once the anomaly data has been collected, the yield of individual chips can be examined to determine whether a chip likely contains vertical interconnect errors that are the result of a defect in the manufacturing tools or process. problems with vertical interconnect stacks may arise from a variety of conditions, including systematic problems with the tools or process, environmental impurities, or simply random anomalies. A certain number of via stack failures are statistically likely, due to environmental impurities and anomalies. In one embodiment of the invention, chips with a statistically significant number of anomalies can be further analyzed, since they have a greater chance of indicating non-systemic problems in the tool or process. The physical location of the anomalies can indicate which part of a tool is malfunctioning. The chip itself may be sliced open at an identified location so that a physical inspection can determine which layer of vertical interconnect or metal contact caused the faulty measurement. Appropriate corrective action can then be taken to fix the manufacturing tool or process that has caused the error in the stack.

What is claimed is:

1. A method for monitoring a semiconductor fabrication process, comprising:
creating a wafer of semiconductor chips, each chip comprising a plurality of diodes, each said diode addressable as part of an array, and each said diode being associated and connected in series to a stack comprising a plurality of vertical interconnects and metal contacts;
addressing the diode and associated stack of vertical interconnects;
measuring the current through each said stack of vertical interconnects in a said array.

2. The method of claim 1, further comprising:
analyzing the measurements to determine whether said measurements meet specifications for functional stacks.

3. The method of claim 2, wherein the analysis of the measurements is conducted in-line during the testing process.

4. The method of claim 2, wherein the analysis of the measurements includes only values that fall within a pre-defined range.

5. The method of claim 2, wherein the analysis of the measurements comprises comparing the voltage measurements against a plurality of known values.

6. The method of claim 2, wherein the plurality of diodes are addressed as a two-dimensional array.

7. The method of claim 2, wherein said diode is addressed using a column decoder and a row decoder.

8. The method of claim 7, wherein a said diode is addressed by the steps comprising:
applying a relatively high voltage to a column of diodes, said column comprising said stack and said diode, said application of relatively high voltage applied to the anode terminal side of the combination of said diode and said stack; and
applying a relatively low voltage to a row of diodes, said row comprising said stack and said diode, said application of relatively low voltage applied to the cathode terminal side of the combination of said diode and said stack.

9. The method of claim 2, further comprising the steps of recording measurements that do not meet specifications, the location of the stacks associated with said measurements, and test parameter information.

10. The method of claim 2, further comprising the steps of sorting the results of said analysis into data sets according to how a via failed to meet said specifications.

11. The method of claim 1, further comprising the steps of testing a plurality of said semiconductor chips on said wafer in parallel.

12. The method of claim 1, further comprising the steps of calculating the resistance of the stack from the current measurement.

13. The method of claim 1, wherein the wafer further comprises a transistor connected in parallel with each said diode, said transistor connected to said stack in series through said transistor's emitter, said transistor connected to the cathode of said diode through said transistor's base.

14. A method for monitoring a semiconductor fabrication process, comprising:
    creating a wafer of semiconductor chips, each chip comprising a plurality of diodes, each said diode addressable as part of an array, each said diode being associated with a stack comprising a plurality of vertical interconnects and metal contacts, wherein said stack and said diode are connected in series to form a diode stack combination;
    addressing one of said diode stack combinations in said array;
    measuring the current through said addressed diode stack combination in a said array.

15. The method of claim 14, further comprising:
    analyzing the measurements to determine whether said measurements meet specifications for functional stacks.

16. The method of claim 15, wherein the analysis of the measurements is conducted in-line during the testing process.

17. The method of claim 15, further comprising the steps of recording measurements that do not meet specifications, the location of the stacks associated with said measurements, and test parameter information.

18. The method of claim 15, further comprising the steps of sorting the results of said analysis into data sets according to how a via failed to meet said specifications.

19. The method of claim 15, wherein the analysis of the measurements includes only values that fall within a predefined range.

20. The method of claim 15, wherein the analysis of the measurements comprises comparing the voltage measurements against a plurality of known values.

21. The method of claim 15, wherein the plurality of diodes are addressed as a two-dimensional array.

22. The method of claim 15, wherein said diode is addressed using a column decoder and a row decoder.

23. The method of claim 22, further comprising:
    applying a relatively high or low voltage to a plurality of columns of said diode stack combinations in said array, connected at a first end of said diode stack combination; and
    applying a relatively high or low voltage to a plurality of rows of said diode stack combinations in said array, connected at a second end of said diode stack combination.

24. The method of claim 23, wherein a said diode is addressed by the steps comprising:
    applying a relatively high voltage to a column of diodes, said column comprising said stack and said diode, said application of relatively high voltage applied to the anode terminal side of the combination of said diode and said stack; and
    applying a relatively low voltage to a row of diodes, said row comprising said stack and said diode, said application of relatively low voltage applied to the cathode terminal side of the combination of said diode and said stack.

25. The method of claim 14, further comprising the steps of testing a plurality of said semiconductor chips on said wafer in parallel.

26. The method of claim 14, further comprising the steps of calculating the resistance of the stack from the current measurement.

* * * * *